(12) United States Patent
Oikawa et al.

(10) Patent No.: US 6,459,292 B1
(45) Date of Patent: Oct. 1, 2002

(54) TESTING SYSTEM FOR SEMICONDUCTOR DEVICE

(75) Inventors: Hisashi Oikawa; Yasuo Watanabe, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/548,580

(22) Filed: Apr. 13, 2000

(30) Foreign Application Priority Data

Apr. 30, 1999 (JP) ............................................. 11-123398
May 18, 1999 (JP) ............................................. 11-137891

(51) Int. Cl.[7] ........................ G01R 31/26; G01R 31/28
(52) U.S. Cl. ....................................... 324/765; 714/724
(58) Field of Search ................................. 324/765, 754, 324/755, 760, 158.1, 758; 714/724, 718, 710

(56) References Cited

U.S. PATENT DOCUMENTS

| | | | |
|---|---|---|---|
| 5,157,664 A | 10/1992 | Waite | |
| 5,337,318 A | 8/1994 | Tsukakoshi et al. | |
| 5,563,520 A | * 10/1996 | Terada | 324/754 |
| 6,138,256 A | * 10/2000 | Debenham | 714/724 |

FOREIGN PATENT DOCUMENTS

| JP | 9-7388 | 1/1997 |
|---|---|---|
| JP | 10170605 | 6/1998 |

* cited by examiner

Primary Examiner—N. Le
Assistant Examiner—J Kerveros
(74) Attorney, Agent, or Firm—Dellett and Walters

(57) ABSTRACT

A testing system for a semiconductor device having a tester carrying out a test for a semiconductor device, a host computer carrying out a repair analysis processing, a tester controller instructing the tester to operate the test and notifying the test result to the host computer. The host computer has a stay-and-resident program necessary for the analytical processing and sends those data to the tester controller in the point in which data showing "repairable or not" is detected.

8 Claims, 4 Drawing Sheets

TESTING SYSTEM FOR SEMICONDUCTOR DEVICE

BACKGROUND OF THE INVENTION

The present invention relates to a testing system for a semiconductor device to test the semiconductor device, more specifically relates to the testing system for the semiconductor device capable of a high-speed judgment concerning repair of a semiconductor memory.

In a step of manufacturing the semiconductor memory so far, memory repair steps as follows is necessary: a function test is carried out for semiconductor memory devices in a status of a wafer before packaging and a defect cell is detected on the basis of fail information as a result of the test to replace to a spare cell. There is one of testing systems for semiconductor devices, having hardware named memory repair analyzer of exclusive use for yielding a repairable resolution to replace a defect cell detected to a spare cell.

FIG. 4 is a view showing an outlined configuration of the conventional testing system for semiconductor devices, having the memory repair analyzer. The testing system for semiconductor devices comprises a work station 1 (EWS), a tester processor (TP) 2, a tester (TESTER) 3, and a memory repair analyzer (MRA) 5. The work station 1 works as an environment processor, mediates the instruction of a work and the notification of a result between a user and the tester, and controls whole of the testing system for semiconductor devices. More specifically, the work station 1 loads a test program on the tester processor 2 to operate a function test and starts up a repair analytical process according to a request outputted from the tester processor 2 to execute a repair analysis by the memory repair analyzer 5. The tester processor 2 works an interface between the work station 1 and the tester 3 and executes a test program, which has been compiled by the work station 1 by loading, on a internal memory, and carries out processing of device measurement such as various tests of functions and a parametric test of DC. The tester 3 comprises an algorithmic pattern generator (ALPG), programmable data selector (PDS), a timing generator, a failure analysis memory 4, a format control, a digital compare, and a DC parametric test unit, which are connected each other via a tester bus used for data transfer. In FIG. 4, only the failure analysis memory 4 is shown and other units have been omitted inconvenience of explanation. In the failure analysis memory 4, a fail data, as a result of the function test, is stored. The memory repair analyzer 5 operates the following series of the processes of the repair analysis: taking the fail data stored in the failure analysis memory 4 into a fail buffer memory, synchronizing to an analysis start signal outputted from the work station 1, detecting a failure cell on the basis of the fail data thereof, finding out a necessary repair resolution in order to make the semiconductor device to a product without defect by replacing the failure cell to a spare cell, and sending the repair resolution to the work station 1.

The above described testing system for semiconductor devices can execute a device measurement (function test) by the tester 3 and a repair analysis by the memory repair analyzer 5 in parallel. Before operating the repair analysis, it is necessary to execute device measurement (function test) by the tester 3 and to previously store the fail data as the result in the failure analysis memory 4. Therefore, in the conventional testing system for semiconductor devices, the tester processor 2 instructs to transfer the fail data from the failure analysis memory 4 to the fail buffer memory of the memory repair analyzer 5 and also instructs to operate the repair analytical process to the work station 1 in the point of the end of the first function test.

The work station 1 received the instruction to execute the repair analysis reads the repair analytical process from a hard disk to start up, reads a file necessary for the analyzing from the hard disk to prepare an analysis data, and sends the analysis data to the memory repair analyzer 5. The memory repair analyzer 5 received the analysis data operates the repair analysis on the basis of the fail data stored in the fail buffer memory, and prepare a repair solution data to return to the work station 1.

The work station 1 received the repair solution data records the repair solution data on the hard disk and notifies finish of the repair analysis to the tester processor 2. The tester 3 has been operating in parallel the next second function test already during the repair analysis by the work station 1 and the memory repair analyzer 5. Therefore, the tester processor 2 received the signal of finish of the repair analysis instructs operation of the repair analysis corresponding to the second function test to the work station 1 and the memory repair analyzer 5 as same as the above described steps, in the point of finish of the second function test. When the second function test had been finished before finish of the repair analysis, the tester processor 2 instructs operation of the repair analysis corresponding to the second function test in the point of receiving the notice of finish of the repair analysis.

Through such steps, by a parallel execution of the repair analysis and the function tests allows the repair analysis and the function test efficiently and in a high speed. Thus, very high throughput is achieved as a whole of the system. However, for test of the semiconductor device, a test may be carried out by reflecting the result of the repair analysis, which corresponds to the first function test previously carried out, to the next function test. For example, as a result of the repair analysis, the total number of testing hours can be shortened for a device determined as unrepairable (NO-GO (defect product)) by omitting the next second function test and the repair analysis corresponding thereto. In such a case, the next second function test should be operated by waiting completion of the repair analysis. This points out the following problems: the function test and the repair analysis should be operated in serial order and alternately; throughput cannot be improved by parallel processing. Also it is a problem that drop of throughput prolongs the time necessary for the repair analysis.

SUMMARY OF THE INVENTION

The present invention has created in consideration of these problems. An object of the invention is to provide a testing system for a semiconductor device allowing parallel operation of the function test and the repair analysis by reflecting the result of the repair analysis to the next test.

Another object of the present invention is to provide a testing system for a semiconductor device allowing shortening of a whole testing time for the repair analysis.

The testing system of the present invention for a semiconductor device, configured by tester unit carrying out a given test for a semiconductor device, host computer unit carrying out a repair analysis processing on the basis of a test result of the tester unit, tester controlling unit instructing the tester unit to operate the test by controlling the tester unit and notify the host computer unit to operate the repair analysis processing on the basis of the test result, wherein the host computer unit sends those data to the tester controlling unit in the point in which data showing repairable or unrepairable is detected as a result of the repair analysis processing to carry out processing for seeking a repair solution for those repairable.

It is important whether the semiconductor device is repairable or unrepairable in case of carrying out a test by reflecting the result of a repair analysis corresponding to previous first function test to the next function test in a test of the semiconductor device. The repair solution itself is not reflected to the next function test. Therefore, in the present invention, the next second function test and the repair analysis processing corresponding thereto can be omitted on the basis of data showing unrepairable status to make shortening of the total number of testing hours possible. Further, for a semiconductor device determined as repairable, computing processing of the repair solution can be carried out in parallel with the next second function test. Thus, the throughput can be improved by a parallel operation.

Especially, as one preferred embodiment of the testing system described above for the semiconductor device, it is preferable that the host computer unit comprises a host controlling unit to control whole and a repair controlling unit to carry out the repair analysis processing, wherein the repair controlling unit operates the repair analysis processing by the direction of the host controlling unit and sends those data to the host controlling unit in the point in which data showing repairable or unrepairable has been detected, and the host controlling unit sends the data showing repairable or unrepairable to the tester controlling unit. In the case that the host computer unit comprises such host controlling unit as a work station and the repair controlling unit to exclusively carry out the repair analysis processing, the data showing repairable or unrepairable obtained by the repair controlling unit is first sent to the tester controlling unit and repair solution is computed later. By such an arrangement, the tester controlling unit can operate the next function test for the semiconductor device determined as repairable in parallel during the repair analysis processing by the repair controlling unit.

Further, it is preferable that a master controlling unit is installed between the repair controlling unit and the host controlling unit as described above in order to control a plurality of repair controlling unit, a shared memory is installed between the master controlling unit and the host controlling unit, a communication between the repair controlling unit and the host controlling unit is carried out via the master controlling unit and the shared memory. Installation of the master controlling unit is for shortening of a communication time in case of sequential communication between the host controlling unit and a plurality of the repair controlling unit. Transmission and receiving of data between the master controlling unit and the host controlling unit are also carried out via the shared memory. Therefore, a time necessary for establishing a communication protocol can be shorten and a time necessary for sending and receiving of data showing repairable or unrepairable and data showing repair solution can be largely shorten.

It is preferable that the repair controlling unit as described above directly reads the test result from a test result store unit, in which the test result has been stored, installed in the tester unit to operate the repair analysis processing. The tester unit has a memory unit of storing a fail data that is a result of the function test. A necessary time for which the repair controlling unit directly reads the fail data as the test result from the memory unit and operates the repair analysis processing is shorter than the necessary time for which the fail data is temporarily transferred from the memory unit to a buffer memory area and the repair analysis processing is operated. Thus, the time necessary for transfer of the test result can omitted to make the time for the test shorten.

The testing system of the present invention for semiconductor devices is configured by including a tester unit for carrying out a given test for a semiconductor device, a host computer unit carrying out a given analysis processing on the basis of a test result of the tester unit, a tester controlling unit controlling the tester unit to operate the test by the tester unit and notify the host computer unit to operate analysis of the test result, wherein the tester controlling unit works as a client, the host computer unit works as a server working with the analysis processing as a daemon object; a shared buffer memory is installed between the tester controlling unit and the host computer unit to communicate between the tester controlling unit and the host computer unit through the shared buffer memory.

Conventional tester controlling unit and host computer unit work independently each other for every operation of the given analysis processing. Therefore, when tester controlling unit instructs preparation of an analytical host process to host computer unit, the host computer unit operates the given analysis processing by generating an analytical host process in accordance with the instruction of the process generated. In contrast, the testing system of the present invention for a semiconductor device is configured by continuously working the analytical host process of the host computer unit side as the daemon object of a server process, and the host computer unit works in a client server type capable of operation of the analysis processing in accordance with a request immediately, when the tester controlling unit requests the analysis processing. Therefore, in comparison with the conventional system, a time for generating a process for every occasion of the analysis processes are omitted and a time up to the start of the analysis processes is largely shortened. Thus, a time for repair analysis is also shortened. In addition, data communication, which works as the client server type, between the tester controlling unit and the host computer unit is operated through the shared memory. Thus, transmission and receiving of data between them can be carried out in a high speed, a time from request of generating analytical host process by the tester controlling unit to the start of the analysis processes by the host computer unit can be further shorten, and the tester controlling unit can be received the result of the analysis from the host computer unit in the high speed.

The testing system of the present invention for a semiconductor device is configured by including a tester unit carrying out a given test for a semiconductor device, a host computer unit carrying out a given analysis processing on the basis of a test result of the tester unit, a tester controlling unit controlling the tester unit to operate the test by the tester unit and notify the host computer unit to operate analysis of the test result, wherein a shared buffer memory is installed between the tester controlling unit and the host computer unit to carry out communication between them through the shared buffer memory. Data communication between the tester controlling unit and the host computer unit through the shared buffer memory make possible transmission of a signal requesting to generate the analytical host process toward the host computer unit in a higher speed than conventional ones, shortening largely the time necessary from request of generation of the analytical host process by the tester controlling unit to start of the analysis processing of the host computer unit, and also a high speed receiving of the result of the analysis from the host computer unit by the tester controlling unit.

In particular, it is preferable to configure to make possible an access to the shared buffer memory by the host computer unit through keeping the shared buffer memory as described above in a memory area of the tester controlling unit. Installing the buffer memory in a memory area of the tester controlling unit does not request a special buffer memory to save a resource for effective use.

DESCRIPTION OF THE PREFERRED EMBODIMENT

Herewith, a preferred embodiment of a testing system of the present invention for a semiconductor device will be described below with reference to the drawings. In the preferred embodiment of the testing system of the present invention for a semiconductor, a work station and a tester processor are worked as a server and a client, respectively, and a repair analytical process is stayed resident in a work station side as a daemon object to work by the tester processor.

Figure 1:
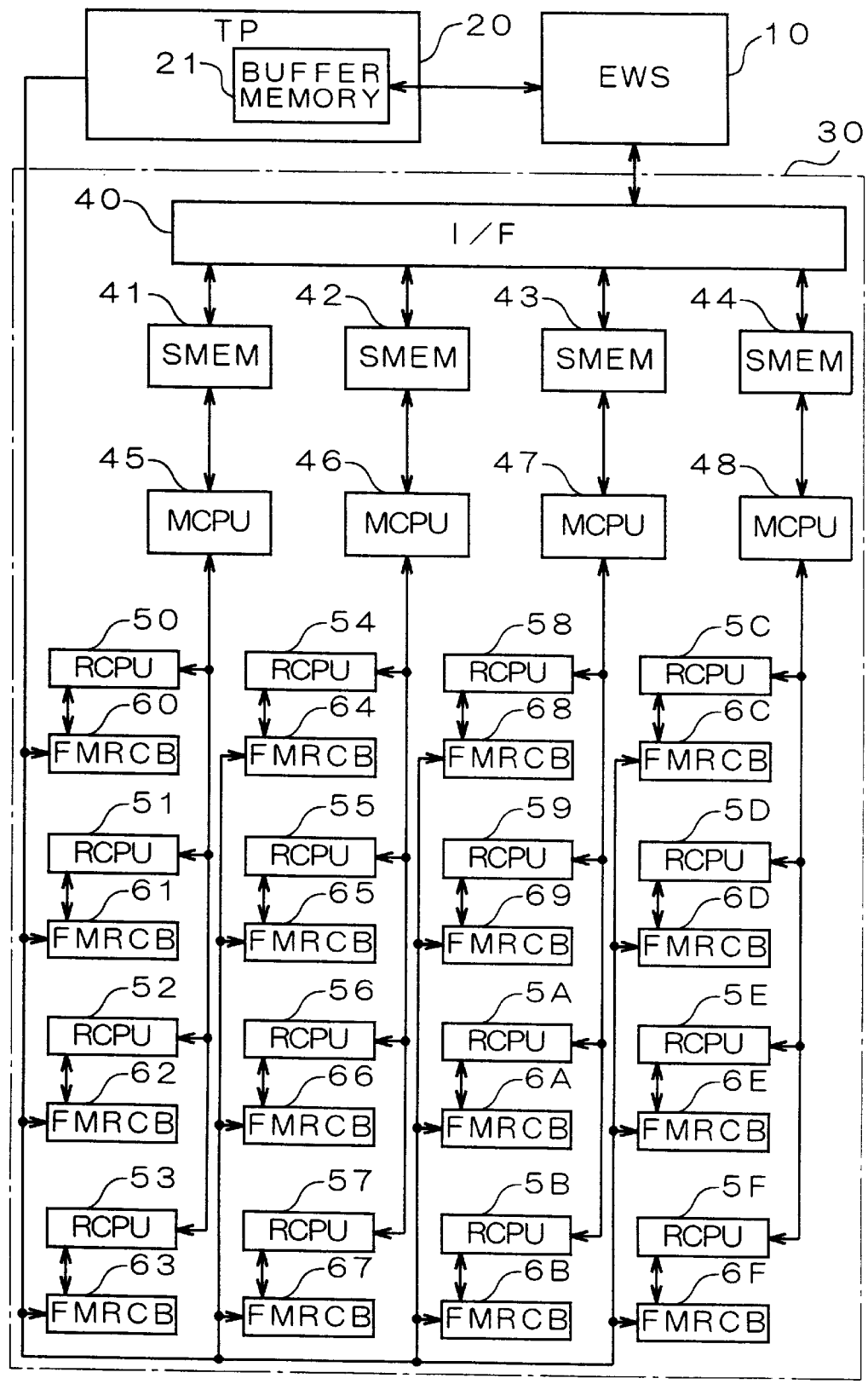
FIG. 1 is a view showing an outlined configuration of a testing system for semiconductor devices.

FIG. 1 is a view showing an outlined configuration of the preferred embodiment of the testing system for semiconductor devices. The testing system for semiconductor devices is configured by a work station (EWS) 10, a tester processor(TP)20, and a tester 30. In the preferred embodiment of the present invention, a memory repair analyzer is regarded as installed in a tester 30. The work station 10 normally mediates an instruction of a work and notice of a result between a user and the tester 30 as an environment processor and controls the whole testing system for semiconductor devices. The work station 10 for the repair analysis processing works as a server and stays resident with the repair analytical process as a daemon object. More specifically, the work station 10 operates a function test and a DC parametric test by loading a test program on the tester processor 20, and operates the repair analytical process by the memory repair analyzer inside the tester 30 through startup of the repair analytical process in accordance with a notice outputted from the tester processor 20.

The tester processor 20 works as an interface between the work station 10 and the tester 30 and executes the test program compiled by the work station 10 by loading on an internal memory to carry out device measurement processing such as various function tests, DC parametric tests or the like. The tester processor 20 works as a client for operation of the repair analysis processing by the work station 10, keeps the area of a buffer memory 21 on a main memory, and operates input and output of various data related to the repair analysis processing from and to the work station 10 through this area. In other words, the work station 10 reads data stored in this buffer memory 21 in operation of the repair analytical process, starts prescribed processing in accordance with the data, and writes data concerning completion of processing into the buffer memory 21 in the point of completion of the processing to input and output a series of data from and to the tester processor 20.

Figure 4:
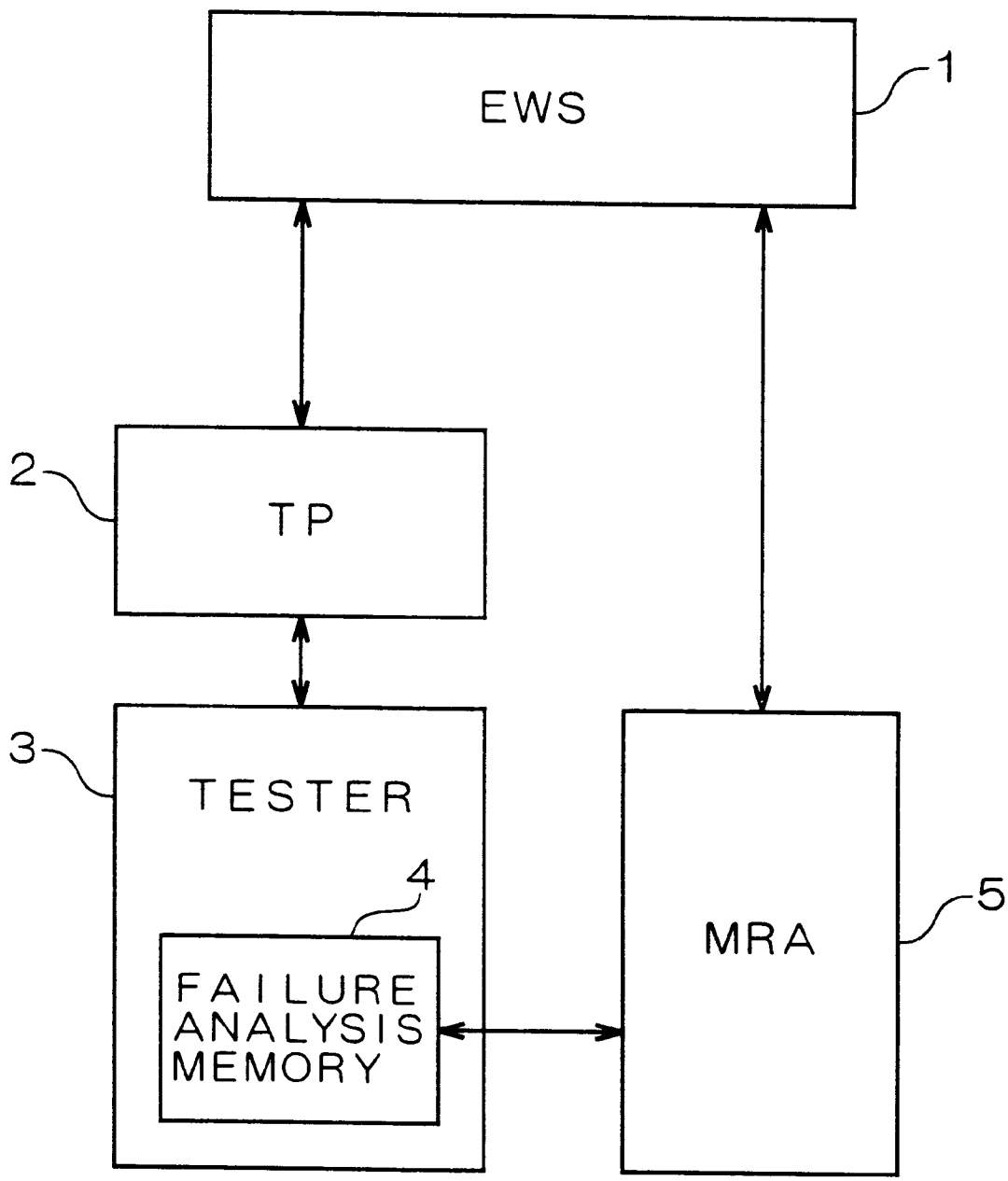
FIG. 4 is a view showing an outlined configuration that has a memory repair analyzer, of a conventional testing system for semiconductor devices.

The tester 30 is configured by an algorithmic pattern generator (ALPG), a programmable data selector (PDS), a timing generator, a fail analysis memory, a format control, a digital compare, a DC parametric test unit, etc. connected via a tester bus used for data transfer. In FIG. 1, units only related to the repair analysis processing are shown and other units are omitted. Besides in the FIG. 1, fail memory repair counter boards (FMRCBs) 60 to 6F correspond to the failure analysis memory 4 of FIG. 4. On the FMRCBs 60 to 6F, a fail memory to store a fail data as a result of the function test, a counter to count fail number in this test, and circuits for checking repairability in the repair analysis and repairing a line fail are loaded. In the preferred embodiment of the present invention, one FMRCB is installed for one device to be measured (DUT; not illustrated). Therefore, the testing system for a semiconductor device of FIG. 1 has a configuration make possible simultaneous processing of device measurement and repair analysis for 16 DUTs.

In the FIG. 1, the memory repair analyzer inside the tester 30 is configured by including a work station interface (I/F) 40, shared memories (SMEM) 41 to 44, master CPUs (MCPUs) 45 to 48, and repair CPUs (RCPUS) 50 to 5F. The RCPUs 50 to 5F are installed corresponding to respective FMRCBs 60 to 6F, directly accesses respective fail memories and fail counters on the FMRCBs 60 to 6F to execute the repair analysis on the basis of these respective data.

The repair analysis processing by the RCPUs 50 to 5F is operated by reading data from FMRCB, and repairing a bit fail, and generating the result of repair to write the result data in the DRAM (not illustrated). More specifically,the repair analysis is operated by sequential processing of the first step for checking of repairability, the second step for repair of line fail, and the third step for repair of the bit fail and by writing result data of respective steps in the DRAM. The result data written in the DRAM are read by the MCPUs 45 to 48 to send to the work station 10.

The repairability check executed in the first step is carried out by examining comparison of number for the maximum repairable cells with number of all fail cells. In the case where data of number for the maximum repairable cells smaller than that of number of all fail cells is set by FMRCB, respective RCPUs 50 to 5F determines unrepairable and writes "NO-GO" data as the result data in the DRAM to set a given flag. On the other hand, in the case where data of number for the maximum repairable cells larger than that of number of all fail cells is set by FMRCB, respective RCPUs 50 to 5F determines repairable and executes repair of the line fail of the second step.

Repair of the line fail in the second step is carried out on the basis of comparison of the line fail number Fr of row side with the spare line number Sr of row side or the line fail number Fc of column side with the spare line number Sc of column side. In the case where data of the line fail number Fr larger than that of spare line number Sr or in the case where data of the line fail number Fc larger than that of spare line number Sc is set by FMRCBs corresponding to respective RCPUs 50 to 5F, respective RCPUs 50 to 5F determines as unrepairable and writes "NO-GO" data as the result data in the DRAM to set the given flag. On the other hand, in the case where data of the line fail number Fr smaller than that of spare line number Sr and in the case where data of the line fail number Fc smaller than that of spare line number Sc is set by FMRCBs corresponding to respective RCPUs 50 to 5F, respective RCPUs 50 to 5F determine as repairable and writes "GO" data as the result data in the DRAM to set the given flag, and executes repair of the bit fail of the third step.

The repair of the bit fail in the third step is carried out by seeking repair solution for all combinations, seeking a resolution yielding the least number of semiconductor device to repair as the repair solution, writing the repair solution as the result data in the DRAM, and setting the given flag.

MCPUs 45 to 48 carried out sending and receiving data between the work station 10 and the RCPUs 50 to 53 through the shared memories 41 to 44, the work station interface 40, and DRAMs in the RCPUs 50 to 53. The shared memories 41 to 44 is possible for common access by MCPUs 45 to 48 and the work station 10 and allocated to correspondence of respective memory areas to RCPUs 50 to 5F. Thus, the memory areas of the shared memory 41 have the first to the fourth areas corresponding to respective RCPUs 50 to 5F. A certain RCPU can be identified in the area in which data has been stored: for example, the data written in the first area is related to RCPU 50 and the data written in the second area is related to RCPU 51. Similarly, other shared memories 42 to 44 have the first to the fourth areas correspond to RCPUs 54 to 57, RCPUs 58 to 5B, RCPUs 5C to 5F, respectively. Therefore, respective MCPUs 45 to 48 can access data in a given memory areas of the shared memories 42 to 44 on the basis of corresponding relationship between respective memory areas of the shared memories 41 to 44 corresponding to respective MCPUs 45 to 48 and RCPUs 50 to 5F, and the work station 10 can carries out data sending and receiving between RCPUs 50 to 5F and the work station 10 in a high speed by accessing data in the given memory area of the shared memories 41 to 44 through the work station interface 40. Besides, data sending and receiving between the MCPUs 45 to 48 and the RCPUs 50 to 5F are carried out through DRAM (not illustrated) installed in the RCPUs 50 to 5F. In this case, whether or not data has been written is determined by setting and resetting the given flag on DRAM.

The tester 30 corresponds to the tester unit, the work station 10, the work station interface 40, the shared memories 41 to 44, the master CPUs 45 to 48, and the repair CPUs 50 to 5F to the host computer unit, the tester processor 20 to the tester controlling unit, respectively. In addition, the work station 10, the repair CPUs 50 to 5F, and fail memory repair counter boards 60 to 6F correspond to the host controlling unit, the repair controlling unit, and the test result store unit, respectively. Furthermore, the master CPUs 45 to 48, the shared memories 41 to 44, and the buffer memory 21 correspond to the master controlling unit, the shared memories, and shared buffer memories, respectively.

Figure 2:
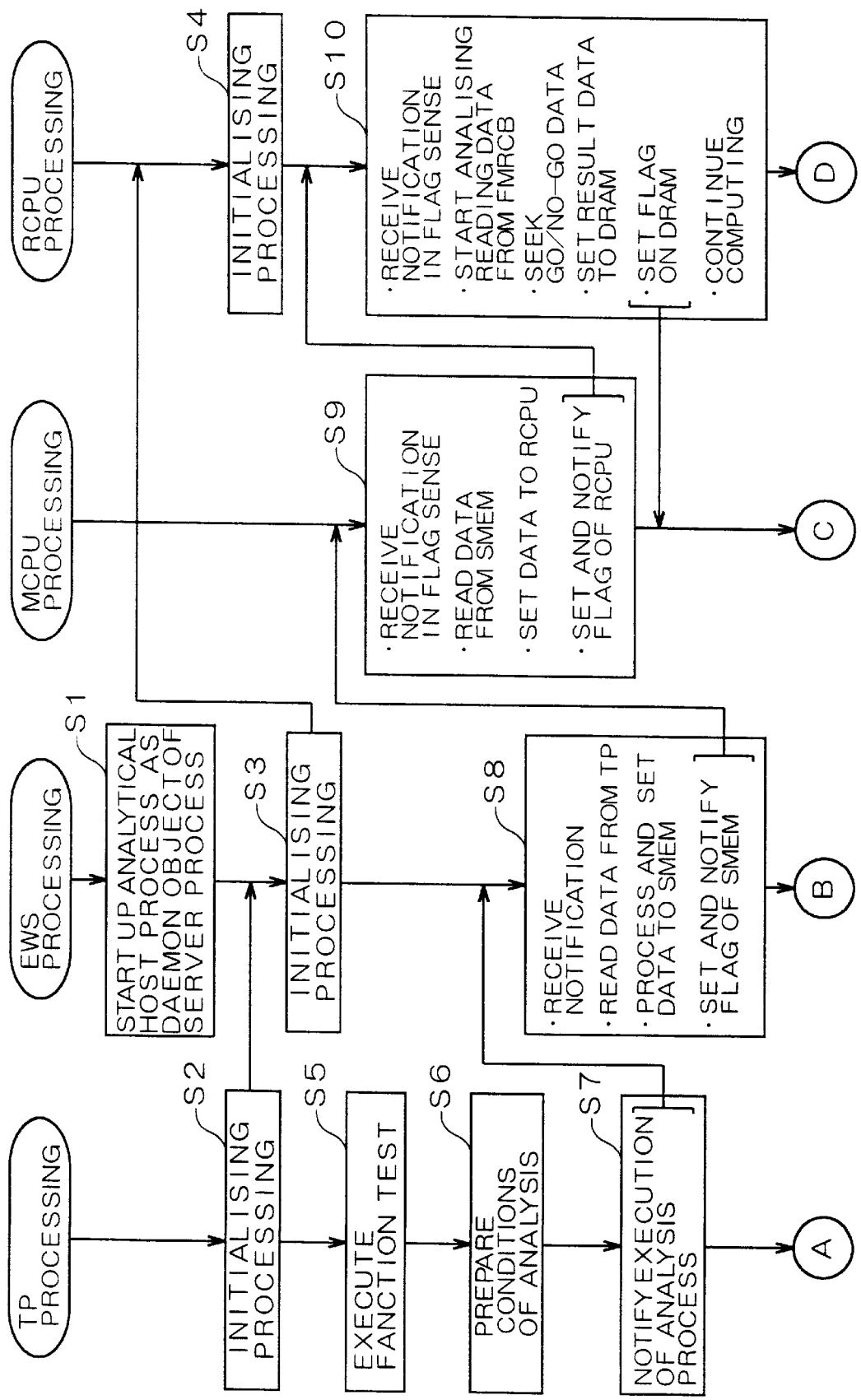
FIG. 2 is a view showing a front half portion of a flow chart showing an outlined operation of a testing system for semiconductor devices related to this preferred embodiment of the present invention.
Figure 3:
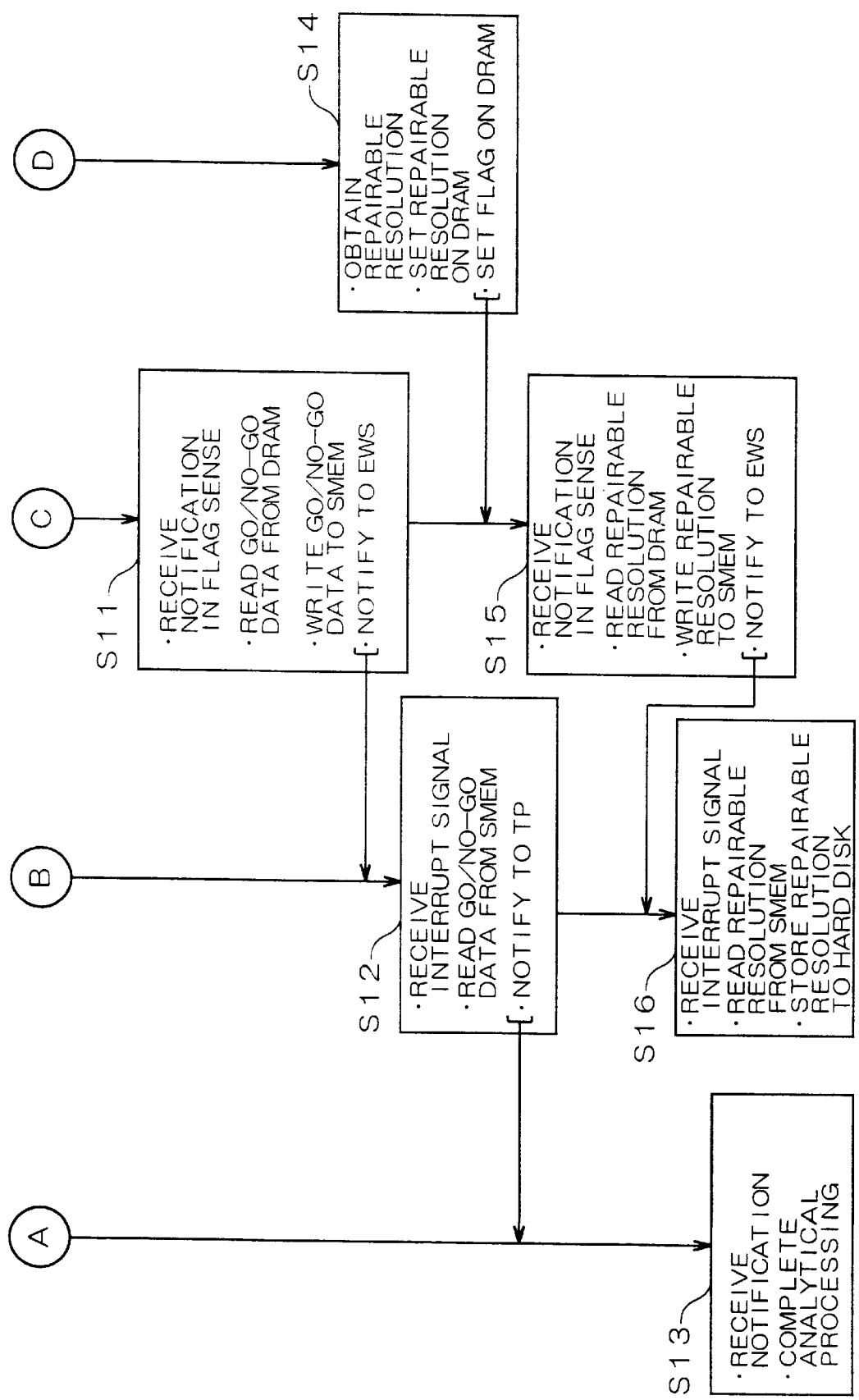
FIG. 3 is a view showing a rear half portion of a flow chart showing an outlined operation of a testing system for semiconductor devices related to this preferred embodiment of the present invention.

Herewith, an operation concerning a preferred embodiment of the testing system of the present invention for a semiconductor device will be described below with reference to the drawings. FIG. 2 is a view showing the front half portion of a flow chart showing an outlined operation of a testing system for semiconductor devices related to this preferred embodiment of the present invention. FIG. 3 is a view showing the rear half portion of a flow chart showing an outlined operation of a testing system for semiconductor devices related to this preferred embodiment of the present invention. In these figures, "TP processing," "EWS processing," "MCPU processing," and "RCPU processing" represent processing operated by the tester processor 20, processing operated by the work station 10, processing operated by any one of the MCPUs 45 to 48, and processing operated by any one of the RCPUs 50 to 5F, respectively. As shown in these figures, the tester processor 20, the work station 10, the MCPUs 45 to 48, and the RCPUs 50 to 5F are operated in parallel, respectively. However, if sending and receiving of a given data are not operated, the operation becomes a status of waiting to stop the next processing. As a whole, the configuration is made to operate a series of repair analysis processing.

First, before operation of processing of each step, the tester processor 20 keeps an area of the buffer memory 21 in the main memory to send and receive data to and from the work station 10 and sends and receives information related to this area from and to the work station 10. After the area of the buffer memory 21 has been kept, the work station 10 in step S1 operates processing in which an analytical host process starts up as the daemon object of a server process and stays on the main memory. By this step, the tester processor 20 noticed the operation of the analytical host process to the work station 10 through the buffer memory 21 to start up immediately the analytical host process by the work station 10. Consequently, compared with the conventional examples, a time for reading a program required for the analysis from the hard disk for operation is shortened in every occasion, resulting in the high-speed start of processing the analysis. Next, loading and startup of the analytical processing program are operated in the RCPUs 50 to 5F.

Instep S2, the tester processor 20 carried out processing of reading a repair condition file from the work station 10 through the buffer memory 21 in order to set it, processing of resetting the fail memory and a repair counter in the tester 30, processing of constructing a system for repair analysis in the tester 30, and processing of notifying the operation of initializing processing of the repair analysis to the work station 10 through the buffer memory 21 as initializing processing.

In step S3, the work station 10 received a notice of operation of initializing processing of the repair analysis from the tester processor 20 through the buffer memory 21, as the initializing processing, operates processing of reading the repair condition file to set it and processing of transmission of the repair condition file to the RCPUs 50 to 5F through the shared memories 41 to 44 and the MCPUs 45 to 48. In step S4, the RCPUs 50 to 5F received the repair condition file operates processing of resetting of data and a flag in the DRAM, processing of startup of analytical processing program, and processing of initializing processing of the given repair analysis.

After completion of the initializing processing related to the series of repair analysis as described above, the tester processor 20 in step S5 operates the tester 30 to carry out the given function test. After completion of the function test by the tester 30, the tester processor 20 in step S6 reads condition of repair analysis defined previously by a user to prepare data related to selection of the DUT as an object of the repair analysis. In the following step S7, the tester processor 20 notifies operation of the analytical host process staying resident in the work station 10 to the work station 10 through the buffer memory 21. In step S8, the work station 10 receives this notice, starts up the analytical host process, reads data related to selection of the DUT from the given area of the buffer memory 21 of the tester processor 20, and processes data for selection of the DUT as the object of the repair analysis condition and the repair analysis to those corresponding to respective RCPUs 50 to 5F. Finally, the work station 10 writes this processed data into the shared memories 41 to 44, sets the given flags of the shared memories 41 to 44, and notify completion of writing of the data to the MCPUs 45 to 48.

In step S9, the MCPUs 45 to 48 receive the notification of completion of data writing, which is sent from the work station 10, in the flag sense of the shared memories 41 to 44 and read the data stored in the given memory area of the shared memories 41 to 44. After step S9, the MCPUs 45 to 48 writes those data in respective DRAMs of the RCPUs 50 to 5F and notifies completion of data writing to respective RCPUs 50 to 5F by setting the given flag of the DRAMs.

Instep S10, the RCPUs 50 to 5F receives the notification, which is described above, from the MCPUs 45 to 48 in the flag sense on the DRAMs, and starts the repair analysis processing reading the fail data and repair count data from FMRCBs 60 to 6F. The RCPUs 50 to 5F seeks first particularly "GO/NO-GO" data in execution of the repair analysis processing to write in the given area of the DRAMs, and sets the given flag of the DRAMs to notify completion of data writing to the MCPUs 45 to 48. When detect the "NO-GO" data in the first step of the repair analysis processing, the RCPUs 50 to 5.F notify the "NO-GO" data to MCPUs 45 to 48 in the point of time. The RCPUs 50 to 5F operate continuously the processing for computing the repair solution of the bit fail, which is the third step of the repair analysis processing for the FMRCBs 60 to 6F for which the result of repair analysis has been determined as a "GO" data. In this step, respective RCPUs 50 to 5F read fail data from the FMRCBs 60 to 6F corresponding to themselves to store in DRAMs, and compute the repair solution of the bit fail on the basis of the data stored.

In step S11, the MCPUs 45 to 48 receive a signal of detection of "GO./NO-GO" data in the flag sense on the DRAMs of RCPUs 50 to 5F to read "GO/NO-GO" data from the DRAMs. The MCPUs 45 to 48 writes the "GO/NO-GO" data, which was read, in the shared memories 41 to 44 to notify to the work station 10 with an interrupt signal. In step S12, the work station 10 received the interrupt signal from the MCPUs 45 to 48 reads the "GO/NO-GO" data from the given area of shared memories 41 to 44, sets the "GO/NO-GO" data in the buffer memory 21 of the tester processor 20, set the given flag, and notifies completion of detection of the "GO/NO-GO" data to the tester processor 20. In step S13, the tester processor 20 received the notification of completion of detection of the "GO/NO-GO" data received the "GO/NO-GO" data, completes the repair analytical process, and moves to operation of the next function test. On the basis of the "NO-GO" data received, the tester processor 20 changes, such as omission of the next function test and the repair analysis processing, contents of the test for a device of which the "NO-GO" data has been detected.

In step S14, RCPUs 50 to 5F operating continually the processing, which is the third step of the repair analysis processing, for computing the repair solution of the bit fail writes. the repair solution, which has been yielded, in the given area of the DRAMs and set the given flag on the DRAMs to notify yield of the repair solution to the MCPUs 45 to 48.

Instep S15, the MCPUs 45 to 48 receive a signal expressing the yield of the repair solution in the flag sense of the DRAMs of the RCPUs 50 to 5F and read the repair solution from the DRAMs. The MCPUs 45 to 48 write the repair solution read in the shared memories 41 to 44 and notifies it by sending an interrupt signal to the work station 10. In step S16, the work station 10, which received the interrupt signal from the MCPUs 45 to 48, reads the repair solution in the given area of the shared memories 41 to 44 and stores the "Go/No-Go" data and the repair solution, which was received in step S12, in the given area of the hard disk. Therefore, the user can read the "GO/NO-GO" data and the repair solution by operating the work station 10 and can confirm a situation of the "GO/NO-GO" of respective DUTs and contents of the repair solution by displaying them.

In the case where and the next second function test is operated in the condition of transferring the repair solution, which corresponds to the result of the first function test, from the RCPUs 50 to 5F to the work station 10, and also where the "GO/NO-GO," which is the result of the repair analysis, was detected, transmission of the "GO/NO-GO" data should be carried out in priority and transfer of the repair solution corresponding to the result of the first function test should be carried out later. The RCPUs 50 to 5F are configured to make keeping of the repair solution corresponding to the result of the first and second function tests possible. In the case where transfer of the repair solution corresponding to the result of the first and second function tests has not been completed, operation of the third function test is not carried out, and the RCPUs 50 to 5F are controlled to become a waiting status until transfer of the repair solution corresponding to the result of the first and second function tests is completed.

In the FIG. 1, a case, where a memory repair analyzer has been mounted inside the tester 30, has been described. However, it goes without saying that the memory repair analyzer has been mounted on an alternative board other than that of the tester 30. Further, the fail data and fail count values stored in the FMRCBs 60 to 6F may be taken in the fail buffer memory before the repair analysis to execute the repair analysis processing on the basis of the data taken in.

Furthermore, in the preferred embodiment as described above, it has been explained that the RCPUs 50 to 5F are installed in respective FMRCBs 60 to 6F (i.e., DUTs) in one-to-one. correspondence and one MCPU is installed for 4 RCPUs. The relationship therebetween is only one example. For example, it maybe carried out that one RCPU is corresponded to a plurality of FMRCBs and one MCPU is corresponded to 8 RCPUs. The relationship of connections between MCPUS, RCPUs, and FMRCBs can be changed freely.

What is claimed is:

1. A testing system for a semiconductor device, configured by comprising:
    a tester unit carrying out a given test for a semiconductor device;
    a host computer unit carrying out a repair analysis processing on the basis of a test result of said tester unit; and
    a tester controlling unit instructing said tester unit to operate said test by controlling said tester unit and notifying said host computer unit to operate said repair analysis processing on the basis of said test result,
    wherein said host computer unit sends repair data to said tester controlling unit at the point in which data showing repairable or unrepairable is detected as a result of said repair analysis processing to carry out processing for seeking a repair solution for those repairable,
    wherein said tester unit and said host computer are connected via a first route through said tester controlling unit, and
    wherein said tester unit and said host computer are connected via a second route without employing said tester controlling unit.

2. The testing system for a semiconductor device according to claim 1, wherein said host computer unit is configured by including a host controlling unit to control the whole testing system and a repair controlling unit to carry out said repair analysis processing, and said repair controlling unit operates said repair analysis processing by the direction of said host computer unit and sends data to said host controlling unit at the point at which said data showing repairable or unrepairable is detected, and said host controlling unit sends said data showing repairable or unrepairable to said tester controlling unit.

3. The testing system for a semiconductor device according to claim 2, wherein a master controlling unit is installed between said repair controlling unit and said host controlling unit to control a plurality of said repair controlling unit, a shared memory is installed between said master controlling unit and said host controlling unit, and a communication between said repair controlling unit and said host controlling unit is carried out through said master controlling unit and said shared memory.

4. The testing system for a semiconductor device according to claim 2, wherein said repair controlling unit directly reads said test result from a test result store unit, installed in said tester unit in order to operate said repair analysis processing.

5. A testing system for a semiconductor device configured by comprising:

a tester unit carrying out a given test for a semiconductor device;

a host computer unit carrying out a given analysis processing on the basis of a test result of said tester unit; and a tester controlling unit controlling said tester unit to operate said test by said tester unit and notifying said host computer unit to operate analysis of said test result, wherein said tester controlling unit works as a client, said host computer unit works as a server working with said analysis processing as a daemon object, and a shared buffer memory is installed between said tester controlling unit and said host computer unit to communicate therebetween through said shared buffer memory, wherein said tester unit and said host computer communicate via a first route through said tester controlling unit, and wherein said tester unit and said host computer communicate via a second route avoiding said tester controlling unit.

6. The testing system for a semiconductor device according to claim 5, wherein said shared buffer memory is kept in a memory area of said tester controlling unit and accesses said shared buffer memory through said host computer unit.

7. A testing system for a semiconductor device configured by comprising:

a tester unit carrying out a given test for a semiconductor device;

a host computer unit carrying out a given analysis processing on the basis of a test result of said tester unit; and a tester controlling unit controlling said tester unit to operate said test by said tester unit and notifying said host computer unit to operate analysis of said test result, wherein the shared buffer memory is installed between said tester controlling unit and said host computer unit to communicate therebetween through said shared buffer memory, wherein said tester unit and said host computer communicate via a first route through said tester controlling unit, and wherein said tester unit and said host computer communicate via a second route without employing said tester controlling unit.

8. The testing system for a semiconductor device according to claim 7, wherein said shared buffer memory is kept in a memory area of said tester controlling unit and accesses said shared buffer memory through said host computer unit.

* * * * *